US012596310B2

(12) United States Patent (10) Patent No.: US 12,596,310 B2
Toda et al. (45) Date of Patent: Apr. 7, 2026

(54) DETECTION DEVICE, LITHOGRAPHY APPARATUS, AND ARTICLE MANUFACTURING METHOD

(71) Applicant: CANON KABUSHIKI KAISHA, Tokyo (JP)

(72) Inventors: Shun Toda, Tochigi (JP); Toshiki Iwai, Saitama (JP); Yasuyuki Unno, Tochigi (JP); Yuichi Fujita, Tochigi (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 357 days.

(21) Appl. No.: 18/346,296

(22) Filed: Jul. 3, 2023

(65) Prior Publication Data

US 2024/0027926 A1 Jan. 25, 2024

(30) Foreign Application Priority Data

Jul. 21, 2022 (JP) ................................. 2022-116575

(51) Int. Cl.
G03F 9/00 (2006.01)
G03F 7/00 (2006.01)

(52) U.S. Cl.
CPC ........ G03F 9/7088 (2013.01); G03F 7/70633 (2013.01)

(58) Field of Classification Search
CPC .. G03F 7/0002; G03F 7/70633; G03F 9/7042; G03F 9/7049; G03F 9/7088
See application file for complete search history.

(56) References Cited

U.S. PATENT DOCUMENTS 7,880,872 B2 2/2011 Nimmakayala et al.
2015/0014892 A1* 1/2015 Shinoda ................ G03F 9/7088
264/447

(Continued)

FOREIGN PATENT DOCUMENTS

JP 2008522412 A 6/2008
KR 1020210149609 A 12/2021

(Continued)

OTHER PUBLICATIONS

Office Action issued in Taiwanese Application No. 112125082 dated Sep. 22, 2025.

*Primary Examiner* — Peter B Kim
(74) *Attorney, Agent, or Firm* — ROSSI, KIMMS & McDOWELL LLP

(57) ABSTRACT

Detection device detects relative position between first and second marks overlapping each other. The device includes illumination system configured to illuminate the first and second marks with illumination light, and detection system configured to form image on imaging surface of image sensor from diffracted lights from the first and the second marks configured to form, on the imaging surface, optical information representing the relative position in first or second direction. The illumination light passes through only optical axis of the illumination system on pupil surface of the illumination system. Light blocking body provided on pupil surface of the detection system includes first light blocking portion crossing optical axis of the detection system in direction conjugate to the first direction, and second light blocking portion crossing the optical axis of the detection system in direction conjugate to the second direction.

13 Claims, 7 Drawing Sheets

(56)          References Cited

U.S. PATENT DOCUMENTS

2017/0040196 A1\*    2/2017    Takakuwa ............. G03F 9/7038
2021/0318626 A1    10/2021    Taki et al.
2021/0372776 A1\*    12/2021    Komaki  ............... G03F 9/7042
2024/0027921 A1\*    1/2024    Iwai .......................... G03F 1/42

FOREIGN PATENT DOCUMENTS

TW          201805741  A       2/2018
TW          201824350  A       7/2018
TW          201935088  A       9/2019
TW          202205031  A       2/2022
WO       2007046820  A2       4/2007

\* cited by examiner

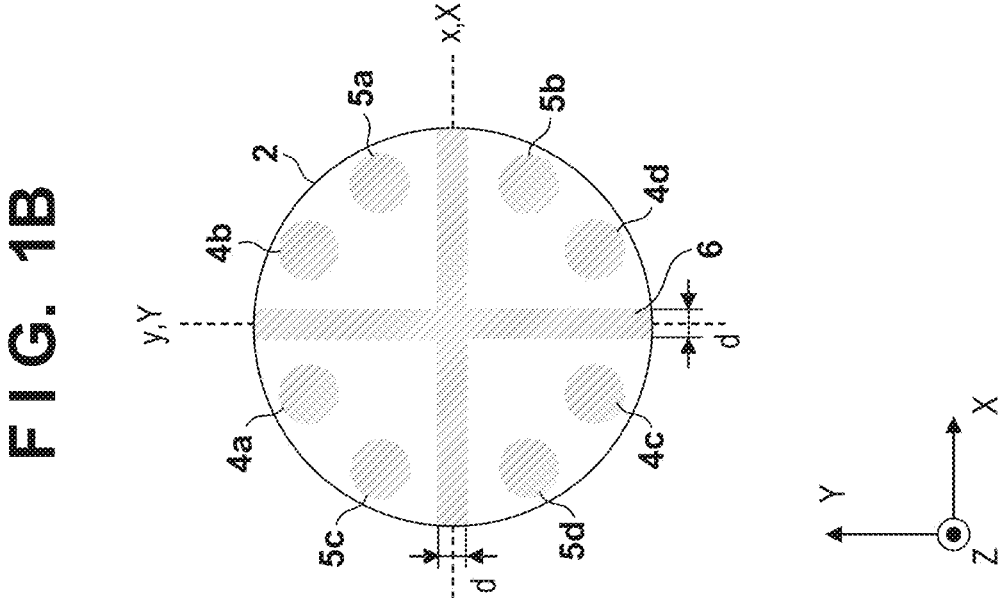
F I G. 1B
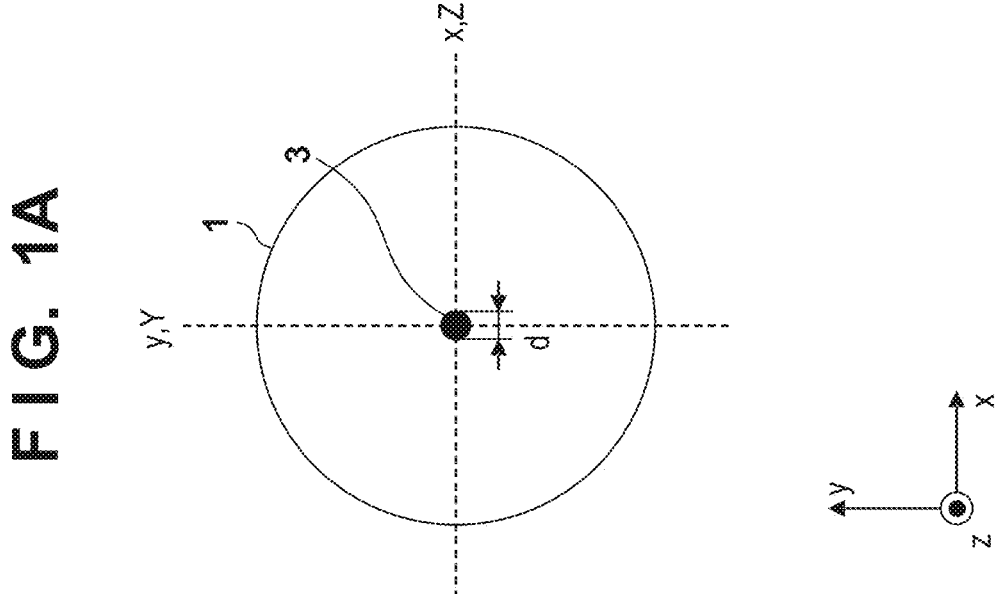
F I G. 1A

F I G. 4A         F I G. 4B
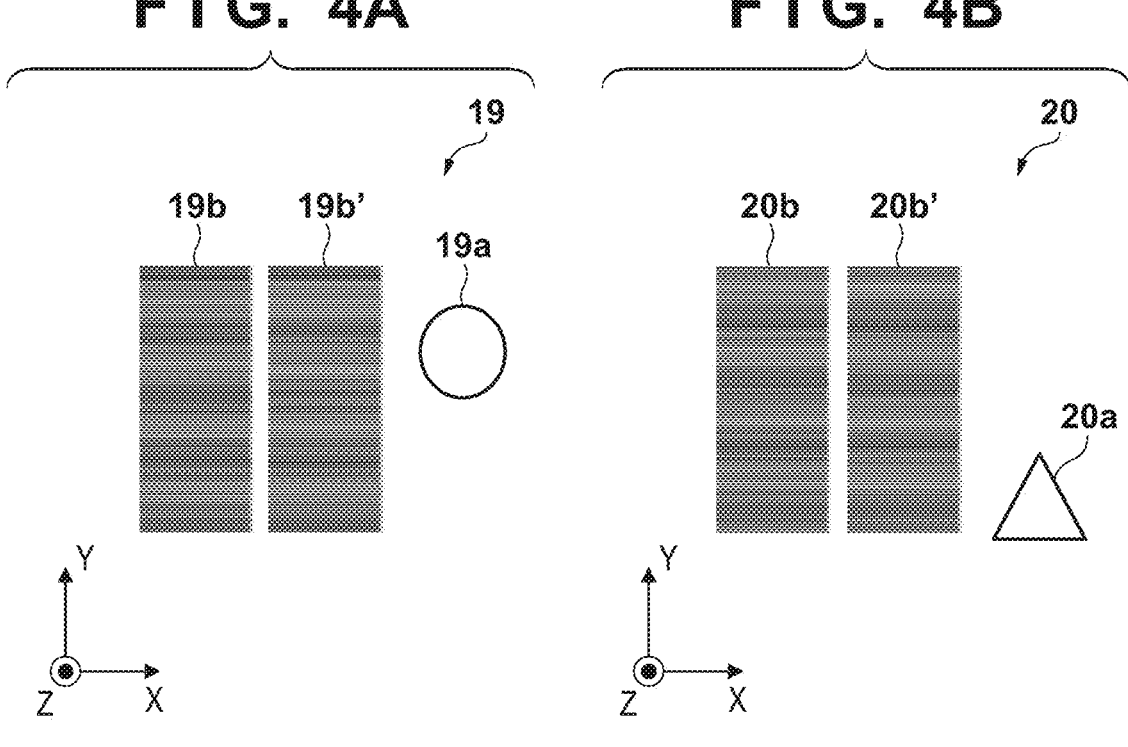
F I G. 5A
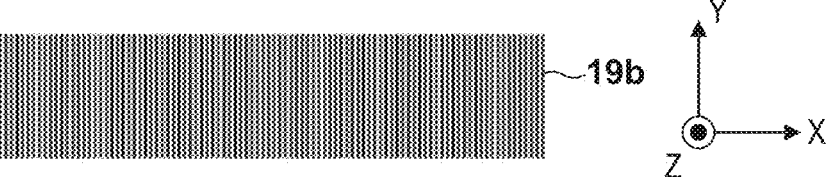
F I G. 5B
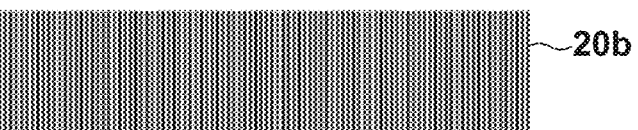
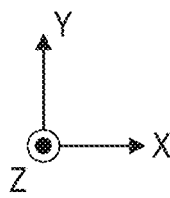
F I G. 5C
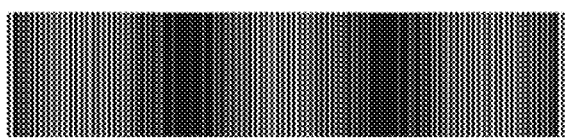
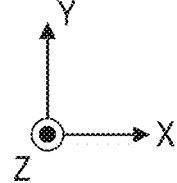
F I G. 5D
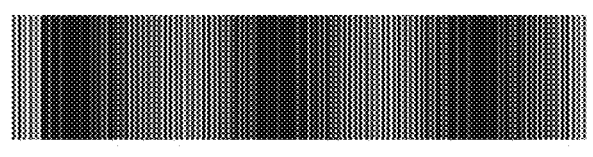
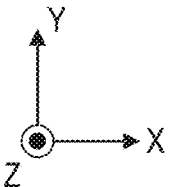

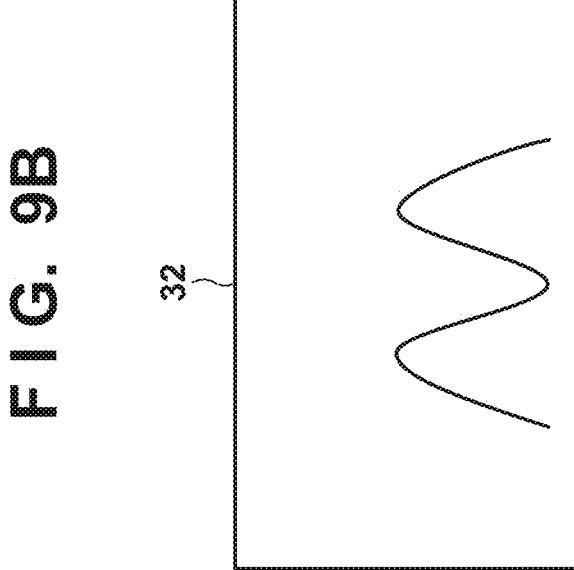
F I G. 9B
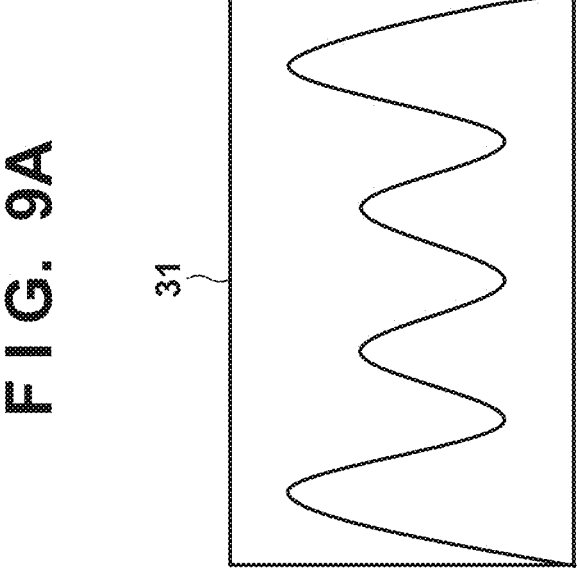
F I G. 9A

DETECTION DEVICE, LITHOGRAPHY APPARATUS, AND ARTICLE MANUFACTURING METHOD

BACKGROUND OF THE INVENTION

Field of the Invention

The present invention relates to a detection device, a lithography apparatus, and an article manufacturing method.

Description of the Related Art

An imprint apparatus brings a mold into contact with an imprint material arranged on a substrate, and cures the imprint material, thereby forming a pattern made of a cured product of the imprint material. In this imprint apparatus, it is important to correctly align the substrate and the mold. Japanese Patent Laid-Open No. 2008-522412 describes a technique of aligning a substrate and a mold using a mark formed by a diffraction grating provided on the substrate and a mark formed by a diffraction grating provided on the mold.

If the mark is illuminated, light reflected by an edge as the boundary between the mark and a region outside the mark enters an image sensor as noise light, and this may decrease the detection accuracy of the mark. Especially, if the area of the mark is reduced, the influence of the noise light on an image formed by light for detecting position information from the mark becomes large, and thus the decrease in detection accuracy may be conspicuous.

SUMMARY OF THE INVENTION

The present invention provides a technique advantageous in detecting the relative position between the first mark and the second mark provided on the first object and second object, respectively, with high detection accuracy.

One of aspects of the present invention provides a detection device for detecting a relative position between a first mark and a second mark respectively provided in a first object and a second object arranged to overlap each other, comprising: an illumination system configured to illuminate the first mark and the second mark with illumination light; and a detection system including an image sensor and configured to form an image on an imaging surface of the image sensor from diffracted lights from the first mark and the second mark illuminated by the illumination system, wherein the first mark and the second mark are configured to form, on the imaging surface, optical information representing the relative position in a first direction or a second direction orthogonal to the first direction, the illumination light is light that passes through only an optical axis of the illumination system and a vicinity of the optical axis on a pupil surface of the illumination system, a light blocking body including a first light blocking portion crossing an optical axis of the detection system in a direction parallel to a third direction and a second light blocking portion crossing the optical axis of the detection system in a direction parallel to a fourth direction is provided on a pupil surface of the detection system, and the third direction is a direction conjugate to the first direction and the fourth direction is a direction conjugate to the second direction.

Further features of the present invention will become apparent from the following description of exemplary embodiments with reference to the attached drawings.

BRIEF DESCRIPTION OF THE DRAWINGS

FIG. 1A is a view exemplifying the light intensity distribution of a pupil surface of an illumination system;

FIG. 1B is a view exemplifying the light intensity distribution of a pupil surface of a detection system;

FIG. 4A is a view exemplifying a mold mark;

FIG. 4B is a view exemplifying a substrate mark;

FIGS. 5A to 5D are views exemplifying diffraction gratings that generate a moiré fringe;

FIGS. 9A and 9B are views for explaining the influence of the presence/absence of pattern edge light on moiré fringe phase difference measurement.

DESCRIPTION OF THE EMBODIMENTS

Figures 2, 3:
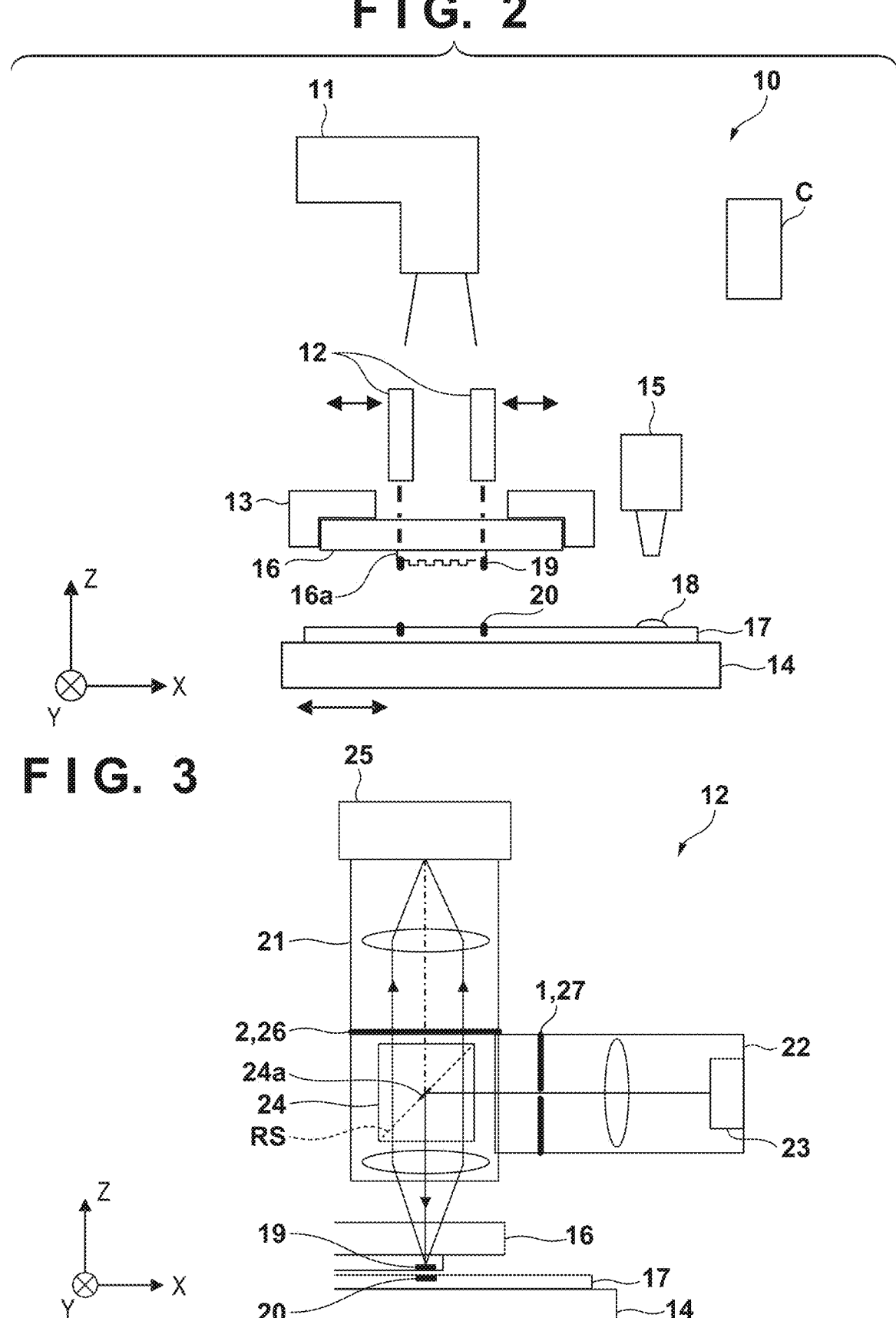
FIG. 2 is a view exemplifying the arrangement of an imprint apparatus as an example of a lithography apparatus.
FIG. 3 is a view exemplifying the arrangement of a detection device.

Hereinafter, embodiments will be described in detail with reference to the attached drawings. Note, the following embodiments are not intended to limit the scope of the claimed invention. Multiple features are described in the embodiments, but limitation is not made to an invention that requires all such features, and multiple such features may be combined as appropriate. Furthermore, in the attached drawings, the same reference numerals are given to the same or similar configurations, and redundant description thereof is omitted.

FIG. 2 shows the arrangement of an imprint apparatus 10 as an example of a lithography apparatus that transfers a pattern of an original to a substrate. The imprint apparatus 10 is used to manufacture a device such as a semiconductor device, and forms a pattern made of a cured product of an imprint material 18 on a substrate 17 by molding the uncured imprint material 18 on the substrate 17 as a processing target object using a mold 16. A pattern forming process of forming a pattern on the substrate 17 by the imprint apparatus 10 can include a contact step, a filling and alignment step, a curing step, and a separation step. In the contact step, the imprint material 18 on a shot region of the substrate 17 and a pattern region 16a of the mold 16 are brought into contact with each other. In the filling and alignment step, a space defined by the shot region of the substrate 17 and the pattern region 16a of the mold 16 is filled with the imprint material 18, and the shot region of the substrate 17 and the pattern region 16a of the mold 16 are aligned. The shot region is a region where the pattern is formed by one pattern forming process. In other words, the shot region is a region where the pattern region 16a of the mold 16 is transferred by one pattern forming process.

As the imprint material, a curable composition (to be also referred to as a resin in an uncured state) to be cured by receiving curing energy is used. As the curing energy, an electromagnetic wave or heat can be used. The electromagnetic wave can be, for example, light selected from the wavelength range of 10 nm (inclusive) to 1 mm (inclusive), for example, infrared light, a visible light beam, or ultraviolet light. The curable composition can be a composition cured by light irradiation or heating. Among compositions, a photo-curable composition cured by light irradiation contains at least a polymerizable compound and a photopolymerization initiator, and may further contain a nonpolymerizable compound or a solvent, as needed. The nonpolymerizable compound is at least one material selected from the group consisting of a sensitizer, a hydrogen donor, an internal mold release agent, a surfactant, an antioxidant, and a polymer component. The imprint material can be arranged on the substrate in the form of droplets or in the form of an island or film formed by connecting a plurality of droplets. The imprint material may be supplied onto the substrate in the form of a film by a spin coater or a slit coater. The viscosity (the viscosity at 25° C.) of the imprint material can be, for example, 1 mPa·s (inclusive) to 100 mPa·s (inclusive). As the material of the substrate, for example, glass, a ceramic, a metal, a semiconductor (Si, GaN, SiC, or the like), a resin, or the like can be used. A member made of a material different from the substrate may be provided on the surface of the substrate, as needed. The substrate is, for example, a silicon wafer, a compound semiconductor wafer, or silica glass. An example of adopting a photo-curable composition as the imprint material will be described below but this is not intended to limit the type of the imprint material.

In the specification and the accompanying drawings, directions will be indicated on an XYZ coordinate system in which directions parallel to the surface of the substrate 17 are defined as the X-Y plane. Directions parallel to the X-axis, the Y-axis, and the Z-axis of the XYZ coordinate system are the X direction, the Y direction, and the Z direction, respectively. A rotation about the X-axis, a rotation about the Y-axis, and a rotation about the Z-axis are $\theta X$, $\theta Y$, and $\theta Z$, respectively. Control or driving concerning the X-axis, the Y-axis, and the Z-axis means control or driving concerning a direction parallel to the X-axis, a direction parallel to the Y-axis, and a direction parallel to the Z-axis, respectively. In addition, control or driving concerning the $\theta X$-axis, the $\theta Y$-axis, and the $\theta Z$-axis means control or driving concerning a rotation about an axis parallel to the X-axis, a rotation about an axis parallel to the Y-axis, and a rotation about an axis parallel to the Z-axis, respectively. In addition, a position is information that can be specified based on coordinates on the X-, Y-, and Z-axes, and an orientation is information that can be specified by values on the $\theta X$-, $\theta Y$-, and $\theta Z$-axes. Positioning means controlling the position and/or orientation. Alignment (positioning) can include controlling the position and/or orientation of at least one of the substrate 17 and the mold such that the alignment error (overlay error) between the shot region of the substrate 17 and the pattern region of the mold 16 decreases. In addition, alignment can include control to correct or change the shape of at least one of the shot region of the substrate 17 and the pattern region of the mold 16. The contact step and the separation step can be executed by driving the mold 16 by a mold driving mechanism 13, but may be executed by driving the substrate 17 by a substrate driving mechanism 14. Alternatively, the contact step and the separation step may be executed by driving the mold 16 by the mold driving mechanism 13 and driving the substrate 17 by the substrate driving mechanism 14.

The imprint apparatus 10 can include a curing unit 11, a detection device 12, the mold driving mechanism 13, the substrate driving mechanism 14, and a control unit C. The imprint apparatus 10 may further include an application unit 15. After the contact step of bringing the mold 16 into contact with the imprint material 18 on the substrate 17, the curing unit 11 irradiates the imprint material 18 with light such as ultraviolet light as curing energy, thereby curing the imprint material 18. The curing unit 11 includes, for example, a light source, and a plurality of optical elements for uniformly irradiating the pattern region 16a of the mold 16 as an irradiated surface with light emitted from the light source in a predetermined shape. In particular, the irradiation region (irradiation range) with light by the curing unit 11 desirably has a surface area almost equal to the surface area of the pattern region 16a or slightly larger than the area of the pattern region 16a. This is to prevent, by making the irradiation region have a minimum necessary area, a situation in which the mold 16 or the substrate 17 expands due to heat generated by irradiation to cause a positional shift or distortion of the pattern transferred to the imprint material 18. In addition, this is to prevent a situation in which light reflected by the substrate 17 or the like reaches the application unit 15 to cure the imprint material 18 remaining in the discharge portion of the application unit 15, and an abnormality thus occurs in the operation of the application unit 15. As the light source, for example, a high-pressure mercury lamp, various kinds of excimer lamps, an excimer laser, or a light-emitting diode can be adopted. The light source can appropriately be selected in accordance with the characteristic of the imprint material 18 as a light receiving object.

FIG. 3 shows an example of the arrangement of the detection device 12. The detection device 12 is configured to optically detect or measure the relative position between a mold mark (first mark) 19 arranged on the mold (first object) 16 and a substrate mark (second mark) 20 arranged on the substrate (second object) 17. The mold mark (first mark) 19 and the substrate mark (second mark) 20 are configured to form optical information representing the relative position in the X direction (first direction) or the Y direction (second direction) on the imaging surface of an image sensor 25 (to be described later). The detection device 12 can include an illumination system 22 and a detection system 21. The illumination system 22 and the detection system 21 can share some components. The illumination system 22 includes a light source 23, and generates illumination light using light from the light source 23 and illuminates measurement target objects (first mark and second mark) with the illumination light. This illumination light can be unpolarized light. The detection system 21 detects the relative position between the mold mark (first mark) 19 and the substrate mark (second mark) 20 as measurement target objects by detecting lights from the measurement target objects illuminated with the illumination light.

Among the optical axes of the detection device 12, an optical axis at the positions of the substrate 17 and the mold 16 is vertical to the upper surface of the substrate 17 and the lower surface (pattern region 16a) of the mold 16, that is, parallel to the Z-axis. The detection device 12 can be configured to be driven in the X direction and the Y direction by a driving mechanism (not shown) in accordance with the positions of the mold mark 19 and the substrate mark 20. The detection device 12 may be configured to be driven in the Z direction to align the focus of the detection system 21 with the position of the mold mark 19 or the substrate mark 20. The detection device 12 may include an optical element or optical system for focus alignment. Based on the relative position between the mold mark 19 and the substrate mark 20 detected or measured using the detection device 12, positioning of the substrate 17 by the substrate driving mechanism 14 and correction of the shape and magnification of the pattern region 16a by a correction mechanism (not shown) can be controlled. The correction mechanism is mounted on the mold driving mechanism 13, and can adjust the shape and magnification of the pattern region 16*a* of the mold 16 by deforming the mold 16. The mold mark 19 and the substrate mark 20 will be described in detail later.

The mold driving mechanism 13 can include a mold chuck (not shown) that holds the mold 16 by a vacuum suction force or an electrostatic force, and a mold driving unit (not shown) that drives the mold 16 by driving the mold chuck. The mold driving mechanism 13 can include the above-described correction mechanism. For example, the mold driving unit can be configured to drive the mold chuck or the mold 16 with respect to the Z-axis. The mold driving unit may be configured to further drive the mold chuck or the mold 16 with respect to at least one of the θX-axis, the θY-axis, the θZ-axis, the X-axis, and the Y-axis.

The substrate driving mechanism 14 can include a substrate chuck that holds the substrate 17 by a vacuum suction force or an electrostatic force, and a substrate driving unit (not shown) that drives the substrate 17 by driving the substrate chuck. For example, the substrate driving unit can be configured to drive the substrate chuck or the substrate 17 with respect to the X-axis, the Y-axis, and the θZ-axis. The substrate driving unit may be configured to further drive the substrate chuck or the substrate 17 with respect to at least one of the θX-axis, the and the Z-axis.

The application unit (dispenser) 15 applies or arranges the uncured imprint material 18 on the substrate 17. The application unit 15 may be arranged outside the housing of the imprint apparatus 10. In this case, the application unit 15 may be understood as a component that is not a component of the imprint apparatus 10.

The mold 16 includes, in the pattern region 16*a*, a pattern such as a circuit pattern to be transferred to the substrate 17 (the imprint material 18 thereon). The mold 16 can be made of a material that transmits light as curing energy, for example, quartz. The substrate 17 can be, for example, a semiconductor substrate such as a single-crystal silicon substrate or a substrate including at least one layer on a semiconductor substrate.

The control unit C can be configured to control the curing unit 11, the detection device 12, the mold driving mechanism 13, the substrate driving mechanism 14, and the application unit 15. The control unit C can be formed by, for example, a Field Programmable Gate Array (FPGA), a computer embedded with a program, or a combination of all or some of these components. The FPGA can include a Programmable Logic Device (PLD) or an Application Specific Integrated Circuit (ASIC). The control unit C includes a memory and a processor, and can define the operation and function of the imprint apparatus 10 by operating based on arithmetic formulas, parameters, and computer programs stored (saved) in the memory. At least part of the function of the detection device 12, for example, a function of processing an image captured by the image sensor 25 may be provided by a module incorporated in the control unit C. In this case, the module of the control unit C can be understood as part of the detection device 12.

An imprint process or pattern forming process executed by the imprint apparatus 10 will now be described. First, the substrate 17 is conveyed to the substrate chuck of the substrate driving mechanism 14 by a substrate conveyance mechanism (not shown), and fixed to the substrate chuck. Subsequently, the substrate 17 is driven by the substrate driving mechanism 14 so that the shot region of the substrate 17 moves to an application position by the application unit 15. After that, the application unit 15 applies, arranges, or supplies the imprint material 18 onto the shot region (imprint region) of the substrate (application step).

Next, the substrate 17 is driven by the substrate driving mechanism 14 so that the shot region where the imprint material 18 has been arranged is arranged at a position immediately below the pattern region 16*a* of the mold 16. Then, for example, the mold driving mechanism 13 lowers the mold 16 to bring the imprint material 18 on the substrate 17 and the pattern region 16*a* of the mold 16 into contact with each other (contact step). This fills the space (including a concave portion of the pattern region 16*a*) between the substrate 17 and the pattern region 16*a* of the mold 16 with the imprint material 18 (filling step). Furthermore, with respect to a plurality of mark pairs each formed by the mold mark 19 and the substrate mark 20, the detection device 12 is used to detect or measure the relative position between the mold mark 19 and the substrate mark 20. Based on the result, the pattern region 16*a* and the shot region of the substrate 17 are aligned (alignment step). At this time, the correction mechanism may be used to correct the shape of the pattern region 16*a* of the mold 16. In addition, a heating mechanism (not shown) may be used to correct the shape of the shot region of the substrate 17.

Upon completion of the filling and alignment steps, the curing unit 11 irradiates the imprint material 18 with light via the mold 16, thereby curing the imprint material 18 (curing step). At this time, the detection device 12 can be driven to retreat so as not to block the optical path of the curing unit 11. Subsequently, the mold driving mechanism 13 raises the mold 16 to separate the mold 16 from the cured imprint material 18 on the substrate 17 (separation step).

The imprint apparatus 10 can be understood as an example of a lithography apparatus that includes the detection device 12, aligns the original (or the pattern region) and the substrate (or the shot region) based on an output from the detection device 12, and transfers the pattern of the original to the substrate. The imprint apparatus 10 aligns the mold 16 (first object or original) provided with the mold mark 19 (first mark) and the substrate 17 (second object) provided with the substrate mark 20 (second mark) based on an output from the detection device 12.

Details of the detection device 12 will be described below with reference to FIG. 3. As described above, the detection device 12 includes the illumination system 22 and the detection system 21, and the illumination system 22 and the detection system 21 can share some components. The illumination system 22 guides illumination light generated by light from the light source 23 to a common optical axis via a prism 24, thereby illuminating the mold mark 19 and the substrate mark 20. The light source 23 can include, for example, at least one of a halogen lamp, an LED, a semiconductor laser (LD), a high-pressure mercury lamp, a metal halide lamp, a supercontinuum light source, and a Laser-Driven Light Source (LDLS). The wavelength of the illumination light generated by the light source 23 is selected not to cure the imprint material 18.

The prism 24 is shared by the illumination system 22 and the detection system 21, and can be arranged on or near a pupil surface 1 of the illumination system 22 or on or near a pupil surface 2 of the detection system 21. Each of the mold mark 19 and the substrate mark 20 can include a mark formed by a diffraction grating. The detection system 21 can form, on the imaging surface of the image sensor 25, an optical image of interference light (an interference fringe or moiré fringe) generated by interference between lights diffracted by the mold mark 19 and the substrate mark 20 which are illuminated by the illumination system 22. The image sensor 25 can be formed by, for example, a CCD sensor or a CMOS sensor.

The prism 24 includes, as a reflective surface RS, a surface (bonding surface) obtained by bonding two members, and includes a reflective film 24*a* on the bonding surface. The prism 24 may be replaced by a plate-shaped optical element having the reflective film 24*a* on its surface. A position at which the prism 24 is arranged need not be on or near the pupil surface 1 of the illumination system 22, or on or near the pupil surface 2 of the detection system 21. An illumination aperture stop 27 (for example, a pinhole plate) can be arranged on the pupil surface 1 of the illumination system 22. A detection aperture stop 26 can be arranged on the pupil surface 2 of the detection system 21. The illumination aperture stop 27 defines the light intensity distribution of the pupil surface 1 of the illumination system 22. Note that the illumination aperture stop 27 may be an arbitrary component, and illumination light parallel to the optical axis may be formed by defining the region of the reflective film 24*a*.

FIG. 4A is a schematic view of the mold mark 19 as an alignment mark. FIG. 4B is a schematic view of the substrate mark 20 as an alignment mark. The mold mark 19 can be formed by, for example, a mark 19*a* and diffraction gratings 19*b* and 19*b*' (shown in FIG. 6A). The substrate mark 20 can be formed by, for example, a mark 20*a* and diffraction gratings 20*b* and 20*b*' (shown in FIG. 6B). The marks 19*a* and 20*a* are rough-detection marks, and the diffraction gratings 19*b*, 19*b*', 20*b*, and 20*b*' are fine-detection marks.

Each of the diffraction gratings 19*b*, 19*b*', 20*b*, and 20*b*' can include a periodic pattern. It is possible to obtain the relative position between the mold 16 and the substrate 17 from the detection result of the detection device 12 with reference to the geometrical center positions of the marks 19*a* and 20*a*. Since an interference fringe (moiré fringe) is generated by diffraction lights from the diffraction grating 19*b* (19*b*') of the mold mark 19 and the diffraction grating 20*b* (20*b*') of the substrate mark 20, the light amount of the moiré fringe changes in accordance with the diffraction efficiency of the mold mark 19 and the substrate mark 20. Especially, since the diffraction efficiency periodically changes in accordance with a change in wavelength, there can exist a wavelength at which it is possible to efficiently detect a moiré fringe and a wavelength at which it is difficult to detect a moiré fringe. Light of a wavelength at which it is difficult to detect a moiré fringe can be noise.

FIGS. 5A to 5D are views each showing an example of a diffraction grating that generates a moiré fringe. The principle of generating a moiré fringe by diffraction lights from the diffraction gratings 19*b* and 20*b* and detection of the relative position between the diffraction gratings 19*b* and 20*b* using the moiré fringe will be described below with reference to FIGS. 5A to 5D. The periods of the patterns (gratings) in the measurement direction of the diffraction grating 19*b* provided in the mold 16 and the diffraction grating 20*b* provided in the substrate 17 are slightly different from each other. If two diffraction gratings having different periods are superimposed on each other, a pattern having a period reflecting the difference in period between the diffraction gratings, that is, a so-called moiré fringe (moiré) appears due to interference between diffracted lights from the two diffraction gratings. At this time, since the phase of the moiré fringe changes in accordance with the relative position between the diffraction gratings, it is possible to obtain the relative position between the diffraction gratings

19*b* and 20*b*, that is, the relative position between the mold 16 and the substrate 17 by detecting the moiré fringe.

Figures 6A, 6B:
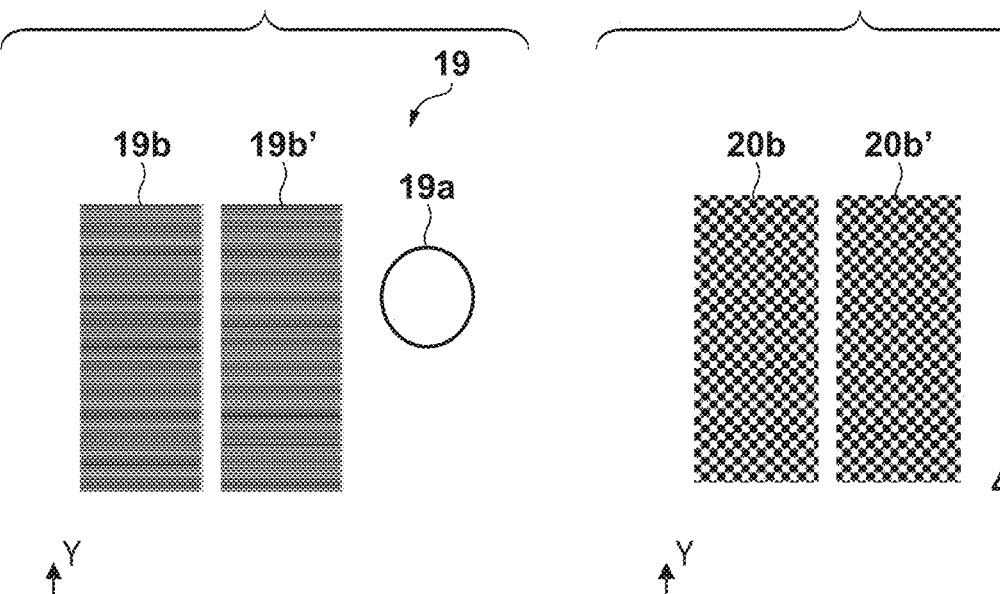
FIGS. 6A and 6B are views exemplifying diffraction gratings that generate a moiré fringe.

More specifically, if the diffraction gratings 19*b* and 20*b* having the slightly different periods are superimposed on each other, the diffracted lights from the diffraction gratings 19*b* and 20*b* overlap each other, thereby generating a moiré fringe having a period reflecting the difference in period, as shown in FIG. 5C. In the moiré fringe, the positions of bright and dark portions (the phase of the fringe) change in accordance with the relative position between the diffraction gratings 19*b* and 20*b*. If, for example, one of the diffraction gratings 19*b* and 20*b* is shifted in the X direction, the moiré fringe shown in FIG. 5C changes to a moiré fringe shown in FIG. 5D. Since the moiré fringe is generated as a fringe having a large period by enlarging the actual positional shift amount between the diffraction gratings 19*b* and 20*b*, even if the resolution of the detection system 21 is low, it is possible to detect the relative position between the diffraction gratings 19*b* and 20*b* with high accuracy. The diffraction gratings 19*b*, 19*b*', 20*b*, and 20*b*' have been described using one-dimensional diffraction grating patterns. However, for example, checkerboard patterns can be used for the diffraction gratings 20*b* and 20*b*', as shown in FIG. 6B. By using a checkerboard pattern as a diffraction grating pattern, it is possible to diffract light not only in the Y direction but also in the X direction.

If there are scattered light from the pattern edge and scattered light from a foreign substance, they cause a measurement error in moiré measurement. If illumination light is made to enter the alignment mark from the Z direction perpendicular to the X-Y plane, noise light passes through the X-axis and the Y-axis of the pupil surface 2 of the detection system 21. This is because the edges of the patterns of the mold mark 19 and the substrate mark 20 are parallel to one of the X-axis and the Y-axis. Therefore, it is preferable to detect, by the image sensor 25, as a signal necessary to detect a moiré fringe, light having passed through a region decentered from the center of the pupil of the detection system 21, and to block noise light entering the X-axis and the Y-axis of the pupil of the detection system 21. This can reduce noise caused by scattered light from the pattern edge. Furthermore, if each of the two sides facing each other of the checkerboard pattern is not parallel to one of the X-axis and the Y-axis, the scattered light from the pattern edge can pass through an axis other than the X-axis and the Y-axis of the pupil surface 2 of the detection system 21. Therefore, each pattern edge is desirably parallel to one of the X-axis and the Y-axis. This is not limited to a case where the diffraction grating pattern of the substrate mark 20 is a checkerboard pattern and the diffraction grating pattern of the mold mark 19 is a line-and-space pattern. For example, the diffraction grating pattern of the substrate mark 20 may be a line-and-space pattern, and the diffraction grating pattern of the mold mark 19 may be a checkerboard pattern.

Next, a method of deciding a relative position by detecting a moiré fringe will be described. The diffraction gratings 19*b* and 20*b* are formed by periodic patterns, and have periods slightly different from each other in the measurement direction. Thus, if these diffraction gratings are superimposed on each other, a moiré fringe whose light intensity changes in the Y direction is formed. Because of the difference in period between the diffraction gratings 19*b* and 20*b*, the shift direction of the moiré fringe when the relative position changes is different. For example, in a case where the period of the diffraction grating 19*b* is slightly larger than the period of the diffraction grating 20*b*, if the substrate 17 relatively shifts in the +Y direction, the moiré fringe also shifts in the +Y direction. On the other hand, in a case where the period of the diffraction grating 19*b* is slightly smaller than the period of the diffraction grating 20*b*, if the substrate 17 relatively shifts in the +Y direction, the moiré fringe shifts in the −Y direction.

The diffraction gratings 19*b*' and 20*b*' form another moiré fringe. The magnitude relationship between the periods of the diffraction gratings 19*b* and 20*b* is reversed with respect to the magnitude relationship between the periods of the diffraction gratings 19*b*' and 20*b*'. Therefore, if the relative position changes, the positions of the two measured moiré fringes change in the opposite directions. If the periodic marks on the mold side and the substrate side, that generate moiré fringes, are shifted by one period, it is impossible to detect the shift for one period in the moiré fringe detection principle. Therefore, by using the marks 19*a* and 20*a* with low detection accuracy, it can be confirmed that there is no relative positional shift for one period between the mold 16 and the substrate 17.

Subsequently, the light intensity distributions on the pupil surface 1 of the illumination system 22 and the pupil surface 2 of the detection system 21 will be exemplarily described with reference to FIGS. 1A and 1B. As exemplified in FIG. 1A, a light intensity distribution 3 having light intensity concentrated at the intersection point (that is, the optical axis) of the x-axis and the y-axis can be generated at the exit of the pupil surface 1 of the illumination system 22. FIG. 1B exemplified a light intensity distribution formed on the pupil surface 1 of the detection system 21 by diffracted lights 4*a* to 4*d*, 5*a* to 5*d*, and 6 from the diffraction gratings 19*b* and 20*b* (19*b*' and 20*b*') illuminated by the light intensity distribution 3. An xyz coordinate system is defined as the coordinate system of the pupil surface 1 of the illumination system 22. The x-axis and the y-axis of the pupil surface 1 of the illumination system 22 coincide with the Z-axis and Y-axis of the XYZ coordinate system, respectively. The x direction parallel to the x-axis is a direction conjugate to the X direction parallel to the X-axis, and the y direction parallel to the y-axis is a direction conjugate to the Y direction parallel to the Y-axis. In the illumination system 22, if the x direction and the X direction are conjugate to each other, this means that the x direction and the X direction coincide with each other in a case where there is no reflective surface (for example, the reflective surface RS) that bends the optical axis of the illumination system 22 between the mold 16/substrate 17 and the pupil surface 1 of the illumination system 22. In the illumination system 22, if the x direction and the X direction are conjugate to each other, this means that the X direction mapped on the pupil surface 1 by the reflective surface coincides with the x direction in a case where there exists the reflective surface that bends the optical axis between the mold 16/substrate 17 and the pupil surface 1. In a case where there exists the reflective surface, the x direction may or may not coincide with the X direction. The same applies to conjugation of the y direction to the Y direction.

In the example shown in FIG. 3, there is no reflective surface that bends the optical axis of the detection system 21 between the mold 16/substrate 17 and the pupil surface 2 of the detection system 21. Therefore, if an xyz coordinate system is defined as the coordinate system of the pupil surface 2 of the detection system 21, the x-axis coincides with the X-axis and the y-axis coincides with the Y-axis. The x direction (third direction) parallel to the x-axis is a direction conjugate to the X direction (first direction) parallel to the X-axis, and the y direction (fourth direction) parallel to the y-axis is a direction conjugate to the Y direction (second direction) parallel to the Y-axis. In the detection system 21, if the x direction and the X direction are conjugate to each other, this means that the x direction and the X direction coincide with each other in a case where there is no reflective surface that bends the optical axis of the detection system 21 between the mold 16/substrate 17 and the pupil surface 2 of the detection system 21. In the detection system 21, if the x direction and the X direction are conjugate to each other, this means that the X direction mapped on the pupil surface 2 by the reflective surface coincides with the x direction in a case where there exists the reflective surface that bends the optical axis between the mold 16/substrate 17 and the pupil surface 2 of the detection system 21. In a case where there exists the reflective surface, the x direction may or may not coincide with the X direction. The same applies to conjugation of the y direction to the Y direction.

A case where the measurement direction (a direction in which the light intensity in the moiré fringe changes) coincides with the X direction (first direction) will now be described. The relative position between the diffraction grating 19*b* (19*b*') of the mold mark 19 and the diffraction grating 20*b* (20*b*') of the substrate mark 20 is equivalent to the relative position between the mold mark 19 and the substrate mark 20. The detection system 21 forms an image on the imaging surface of the image sensor 25 from information representing the relative position between the diffraction grating 19*b* (19*b*') of the mold mark 19 and the diffraction grating 20*b* (20*b*') of the substrate mark 20 in the measurement direction.

Consider a case where the light intensity distribution 3 having light intensity concentrated at and near the intersection point (the optical axis of the illumination system 22) of the X-axis and the Y-axis is formed at the exit of the pupil surface 1 of the illumination system 22, in other words, a case where the illumination light passes through only the optical axis of the illumination system 22 and its vicinity on the pupil surface 1 of the illumination system 22. In this case, it can be considered that only a light component, parallel to the optical axis, of the light emitted from the light source 23 enters the mold mark 19 (diffraction gratings 19*b* and 19*b*') as illumination light. In the mold mark 19 (diffraction gratings 19*b* and 19*b*'), plus first-order diffracted light and minus first-order diffracted light are generated in the X-axis direction. Among the diffracted lights generated by the mold mark 19 (diffraction gratings 19*b* and 19*b*'), the plus first-order diffracted light is light diffracted in the positive direction of the X-axis with respect to the optical axis, and the minus first-order diffracted light is light diffracted in the negative direction of the X-axis with respect to the optical axis. Each diffracted light enters the substrate mark 20 (diffraction gratings 20*b* and thereby generating plus first-order diffracted light and minus first-order diffracted light. Since the substrate mark 20 includes a checkerboard pattern, the traveling direction of the light diffracted by the substrate mark 20 has both an X-axis component and a Y-axis component. Among diffraction lights generated by the substrate mark 20, the plus first-order diffracted light is diffracted light including a positive-direction component of the Y-axis with respect to the optical axis in the traveling direction, and the minus first-order diffracted light is diffracted light including a negative-direction component of the Y-axis with respect to the optical axis in the traveling direction.

Referring to FIGS. 1A and 1B, for example, on the pupil surface 2 of the detection system 21, the diffracted light 4*a* represents light obtained when the illumination light enters the mold mark 19, is diffracted in the minus first-order direction, and is diffracted in the plus first-order direction at the substrate mark 20. The diffracted light 4*a* is represented as (−1, +1). In accordance with this representation method, in addition to the diffracted light (−1, +1), the diffracted light 4*b* (+1, +1), the diffracted light 4*c* (−1, −1), and the diffracted light 4*d* (+1, −1) enter the pupil surface 2. An image is formed on the imaging surface of the image sensor 25 from the diffracted lights 4*a* and 4*b*, thereby generating an interference fringe (moiré fringe) whose light intensity changes in the X direction. Similarly, with the diffracted lights 4*c* and 4*d*, an interference fringe whose light intensity changes in the X direction is generated.

The pitch of the mold mark 19 (19*b* and 19*b*') is represented by Pmx, and the pitches in the X direction and Y direction of the substrate mark 20 (20*b* and 20*b*') are presented by Pwx and Pwy, respectively. The distance from the X-axis of the diffracted light 4*a* on the pupil surface 2 of the detection system 21 can be given by f·tan θwy where f represents the focal length of a lens group arranged between the pupil surface 2 of the detection system 21 and the mold mark 19/substrate mark 20, and θwy represents a diffraction angle in the Y direction in the substrate mark 20. The diffraction angle θwy is arcsin(λ/Pwy). This is because a diffraction angle θ can be given by sin θ=λ/p where λ represents the wavelength of light and p represents a mark pitch. The wavelength λ may be, for example, a single wavelength like in a case where a laser light source is used, or may have an intensity distribution in a wavelength band of 500 to 800 nm. On the other hand, the distance from the Y-axis of the diffracted light 4*a* can be given by f·tan(θmx−θwx) where θmx represents a diffraction angle in the X-axis direction in the mold mark 19, and θwx represents a diffraction angle in the X-axis direction in the substrate mark 20. θmx−θwx is arcsin(λ/Pmx)−arcsin(λ/Pwx). This is because light entering the mold mark 19/substrate mark 20 is diffracted by each of the mold mark 19 and the substrate mark 20 in the X-axis direction. Furthermore, the same applies to the mold mark 19/substrate mark 20 in a case where the measurement direction is the same as the Y-axis (second direction) orthogonal to the X-axis of the pupil surface 1 or 2, and the diffracted lights 5*a*, 5*c*, and 5*d* can be described.

Figure 7:
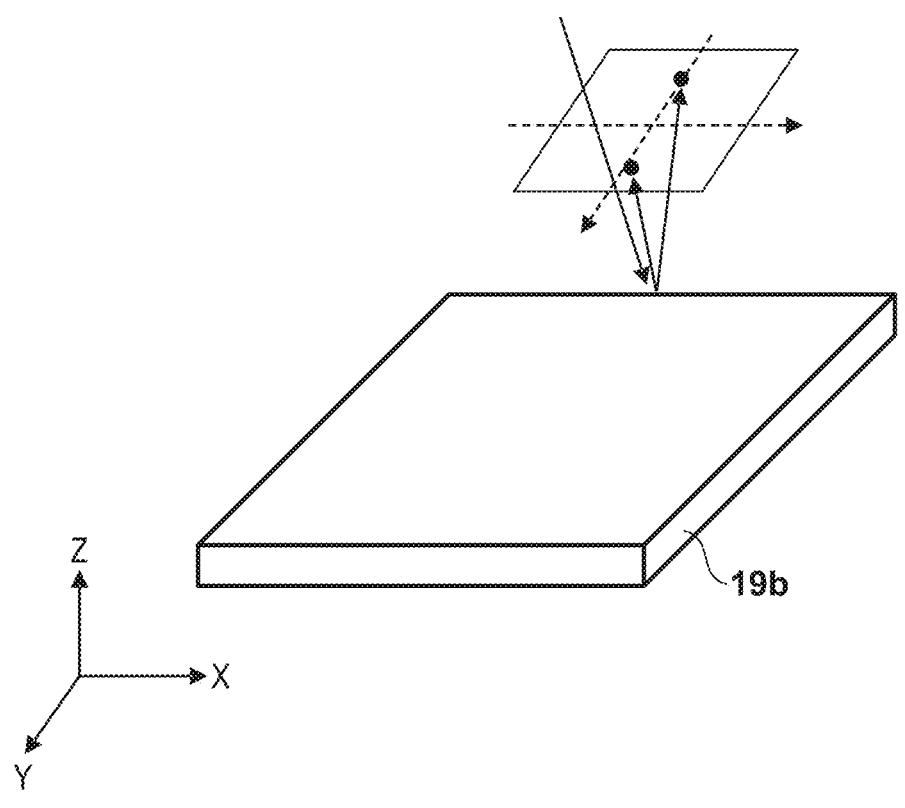
FIG. 7 is a view exemplifying pattern edge light.

The pattern edge light 6 will be described with reference to FIG. 7. The pattern edge light 6 is diffracted light at each of the edges of the whole patterns of the diffraction gratings 19*b* (19*b*') and 20*b* (20*b*') of the mold mark 19 and the substrate mark 20. Note that in the edge portion of each small pattern element forming the diffraction gratings 19*b* (19*b*') and 20*b* (20*b*'), the pitch is small and thus diffracted light is not detected. The pattern edge light in the diffraction grating 19*b* of the mold mark 19 will be described. Light entering the edge of the whole diffraction grating 19*b* is diffracted only in an axis direction orthogonal to the edge. This is because the edge of the whole diffraction grating 19*b* is parallel to one of the X-axis and the Y-axis. If, for example, light enters the edge in a direction parallel to the X-axis, diffracted light is in a direction parallel to the Y-axis direction. On the other hand, if light enters the edge in a direction parallel to the Y-axis direction, the light is diffracted in a direction parallel to the X-axis direction. The same applies to the diffracted lights from the diffraction grating 19*b*' of the mold mark 19 and the diffraction gratings 20*b* and 20*b*' of the substrate mark 20. Therefore, the pattern edge light 6 passes through the X-axis and its vicinity and the Y-axis and its vicinity on the pupil surface 2 of the detection system 21.

Figure 8B:
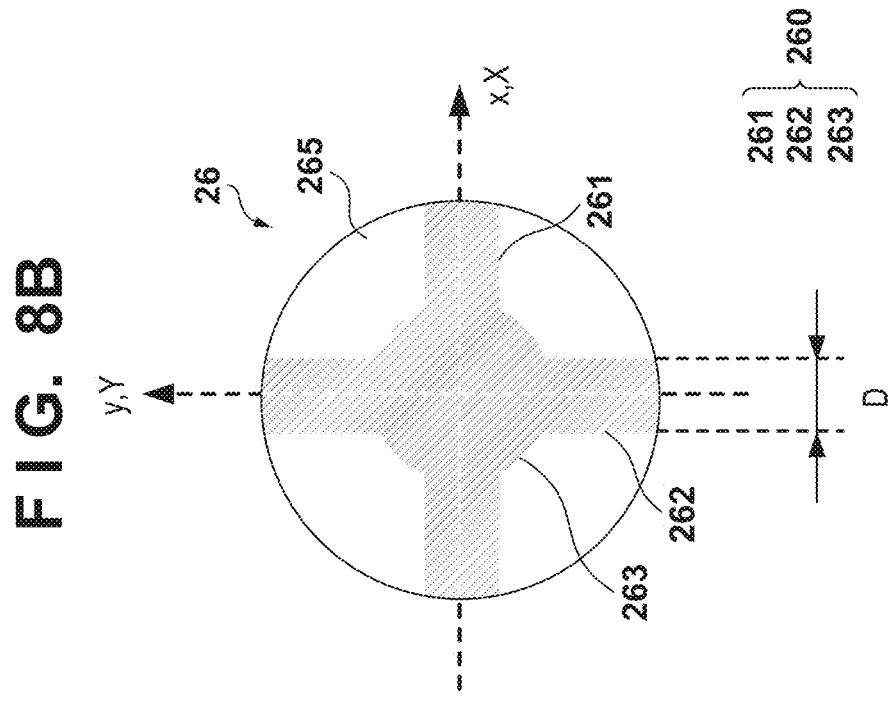
FIG. 8B is a view exemplifying an illumination aperture stop arranged on the pupil surface of the detection system.
Figure 8A:
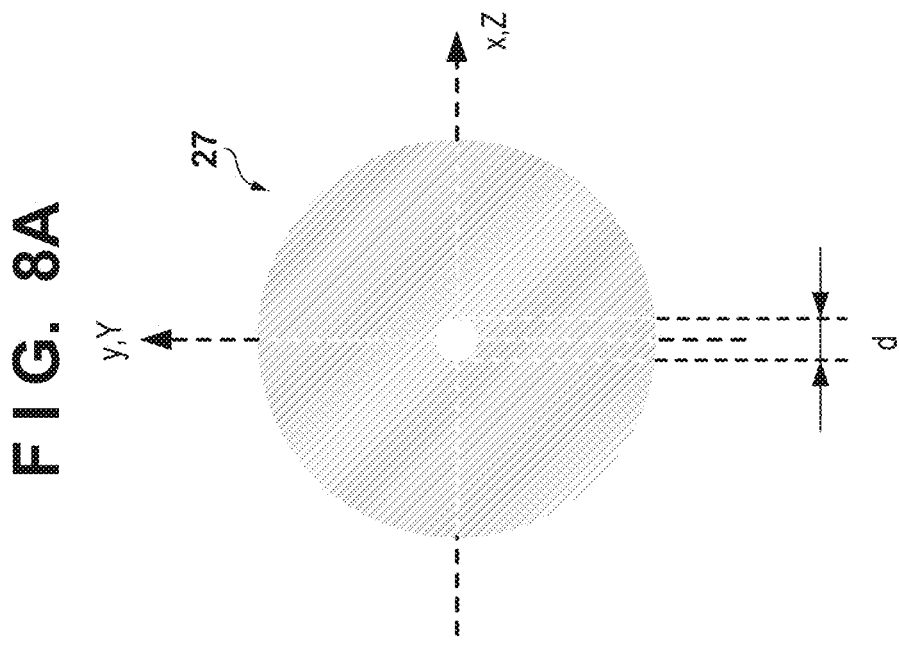
FIG. 8A is a view exemplifying an illumination aperture stop arranged on the pupil surface of the illumination system.

The illumination aperture stop 27 and the detection aperture stop 26 for removing the pattern edge light 6 as unnecessary light will be described with reference to FIGS. 8A and 8B. To make light parallel to the optical axis enter the mold mark 19, it is advantageous to form a light intensity distribution having light intensity concentrated only at and near the intersection point (that is, the optical axis) of the X-axis and the Y-axis at the exit of the pupil surface 1 of the illumination system 22. To do this, the illumination aperture stop 27 (pinhole plate) including an opening (pinhole) at the intersection point of the X-axis and the Y-axis can be arranged on the pupil surface 1. This makes it possible to cause only light parallel to the optical axis of the light source 23 to enter the mold mark 19 (diffraction gratings 19*b* and 19*b*').

The diffracted lights 4*a* to 4*d* and 5*a* to 5*d* from which a moiré fringe is formed on the imaging surface of the image sensor 25 enter a region not on the X-axis and the Y-axis on the pupil surface 2 of the detection system 21. On the other hand, the pattern edge light 6 enters the X-axis and its vicinity and the Y-axis and its vicinity on the pupil surface 2 of the detection system 21. The pattern edge light 6 is noise light when measuring the relative position between the diffraction gratings 19*b* (19*b*') and 20*b* (20*b*') from the moiré fringe phase difference. To cope with this, the detection aperture stop 26 including a light blocking body 260 is arranged on and near the X-axis and on and near the Y-axis on the pupil surface 2 of the detection system 21, thereby making it possible to block the pattern edge light 6.

The light blocking body 260 arranged on the pupil surface 2 of the detection system 21 can include a first light blocking portion 261 crossing the optical axis of the detection system 21 in the direction (third direction) parallel to the x-axis, and a second light blocking portion 262 crossing the optical axis of the detection system 21 in the direction (fourth direction) parallel to the y-axis. The light blocking body 260 may further include a third light blocking portion 263 aligned with the optical axis. The third light blocking portion can have a circular shape. As described above, the direction (third direction) parallel to the x-axis is a direction conjugate to the direction (first direction) parallel to the X-axis, and the direction (fourth direction) parallel to the y-axis is a direction conjugate to the direction (second direction) parallel to the Y-axis. The illumination aperture stop 27 is a pinhole plate including a pinhole with a diameter d.

The pupil surface 2 of the detection system 21 includes a light transmitting region 265 in a region where no light blocking body 260 is arranged. The diffracted lights from the mold mark 19 (19*b* and 19*b*') and the substrate mark 20 (20*b* and 20*b*') illuminated with the illumination light pass through the light transmitting region 265, thereby forming optical information representing the relative position between the mold 16 and the substrate 17 on the imaging surface of the image sensor 25. Of the lights from the mold mark 19 (19*b* and 19*b*') and the substrate mark 20 (20*b* and 20*b*') illuminated with the illumination light, unnecessary light including no optical information representing the relative position can be blocked by the first light blocking portion 261 and the second light blocking portion 262.

In a case where the diameter of the concentrated light intensity portion (that is, the pinhole) in the light intensity distribution 3 formed at the exit of the pupil surface 1 of the illumination system 22 is represented by d, the width of the pattern edge light 6 on the pupil surface 2 of the detection system 21 is also d. Therefore, to block the pattern edge light 6, a width D of the first light blocking portion 261 and the second light blocking portion 262 of the detection aperture stop 26 is preferably equal to or larger than d. The diffracted lights 4a to 4d and 5a to 5d for forming an image on the imaging surface of the image sensor 25 from the moiré fringe need to enter a region other than the light blocking body 260 on the pupil surface 2 of the detection system 21. For example, with respect to the diffracted light 4a, the distance |f·tan θwy| from the X-axis and the distance |f·tan (θmx−θwx)| from the Y-axis are preferably larger than the sum of half of the width D of the light blocking body 260 and a radius r of the diffracted light 4a on the pupil surface 2 of the detection system 21. In this example, the width D of the light blocking body 260 is the width in the X direction of the second light blocking portion 262 with respect to the X direction, and is the width in the Y direction of the first light blocking portion 261 with respect to the Y direction. If the condition is represented by formulas, the width D of the light blocking body 260 preferably satisfies the following expressions.

$$|f\cdot\tan\ \theta wy|-r \geq D/2 \geq d/2,\ and$$

$$|f\cdot\tan(\theta mx-\theta wx)|-r \geq D/2 \geq d/2$$

In this example, r is larger than d since the number of pitches of the mold mark 19 and the substrate mark 20 is infinite. For example, in the case of the diffracted light 5a, the width D of the light blocking body preferably satisfies the following expressions.

$$|f\cdot\tan\ \theta wx|-r \geq D/2 \geq d/2,\ and$$

$$|f\cdot\tan(\theta my-\theta wy)|-r \geq D/2 \geq d/2$$

Note that the mark that generates the diffracted light 5a is a mark whose measurement direction is the Y direction.

The influence of the presence/absence of the pattern edge light 6 on moiré fringe phase difference measurement will be described with reference to FIGS. 9A and 9B. As shown in an arbitrary section 31 in the measurement direction of the moiré fringe including the pattern edge light 6, if the pattern edge light 6 exists in each edge portion of the moiré fringe, this becomes a noise component, thereby degrading the measurement accuracy of the relative phase. As the moiré fringe is closer to the pattern edge light 6, the influence of the noise component is larger. Thus, it is difficult to decrease the size of the alignment mark. On the other hand, as shown in an arbitrary section 32 in the measurement direction of the moiré fringe from which the pattern edge light 6 has been removed, if there is only a moiré signal, the measurement accuracy of the relative phase is improved. In addition, when the shot noise of the image sensor 25 is reduced, it is also expected to improve the measurement accuracy of the relative phase.

An article manufacturing method using an imprint apparatus represented by the above-described embodiment will be described next. The article can be, for example, a semiconductor device, a display device, a MEMS, or the like. The article manufacturing method can include a transfer step of transferring a pattern of an original to a substrate using a lithography apparatus or an imprint apparatus, and a processing step of processing the substrate so as to obtain an article from the substrate having undergone the transfer step. The transfer step can include a contact step of bringing the mold 16 and the imprint material 18 on the shot region of the substrate 17 into contact with each other. The transfer step can also include a measurement step of measuring the relative position between the mold 16 and the shot region (or the substrate mark) of the substrate 17. The transfer step can also include an alignment step of aligning the mold 16 and the shot region of the substrate 17 based on the result of the measurement step. The transfer step can also include a curing step of curing the imprint material 18 on the substrate 17 and a separation step of separating the imprint material 18 from the mold 16. This forms or transfers the pattern made of a cured product of the imprint material 18 on the substrate 17. The processing step can include, for example, etching, resist peeling, dicing, bonding, and packaging.

The pattern made of the cured product formed using the imprint apparatus is used permanently for at least some of various kinds of articles or temporarily when manufacturing various kinds of articles. The articles are an electric circuit element, an optical element, a MEMS, a recording element, a sensor, a mold, and the like. Examples of the electric circuit element are volatile and nonvolatile semiconductor memories such as a DRAM, an SRAM, a flash memory, and an MRAM and semiconductor elements such as an LSI, a CCD, an image sensor, and an FPGA. Examples of the mold are molds for imprint.

The pattern of the cured product is directly used as the constituent member of at least some of the above-described articles or used temporarily as a resist mask. After etching or ion implantation is performed in the substrate processing step, the resist mask is removed.

An article manufacturing method in which an imprint apparatus forms a pattern on a substrate, processes the substrate on which the pattern has been formed, and manufactures an article from the processed substrate will be described next. As shown FIG. 10A, a substrate 1z such as a silicon wafer with a processed material 2z such as an insulator formed on the surface is prepared. Next, an imprint material 3z is applied to the surface of the processed material 2z by an inkjet method or the like. A state in which imprint material 3z is applied as a plurality of droplets onto the substrate is shown here.

Figures 10A, 10B, 10C, 10D, 10E, 10F:
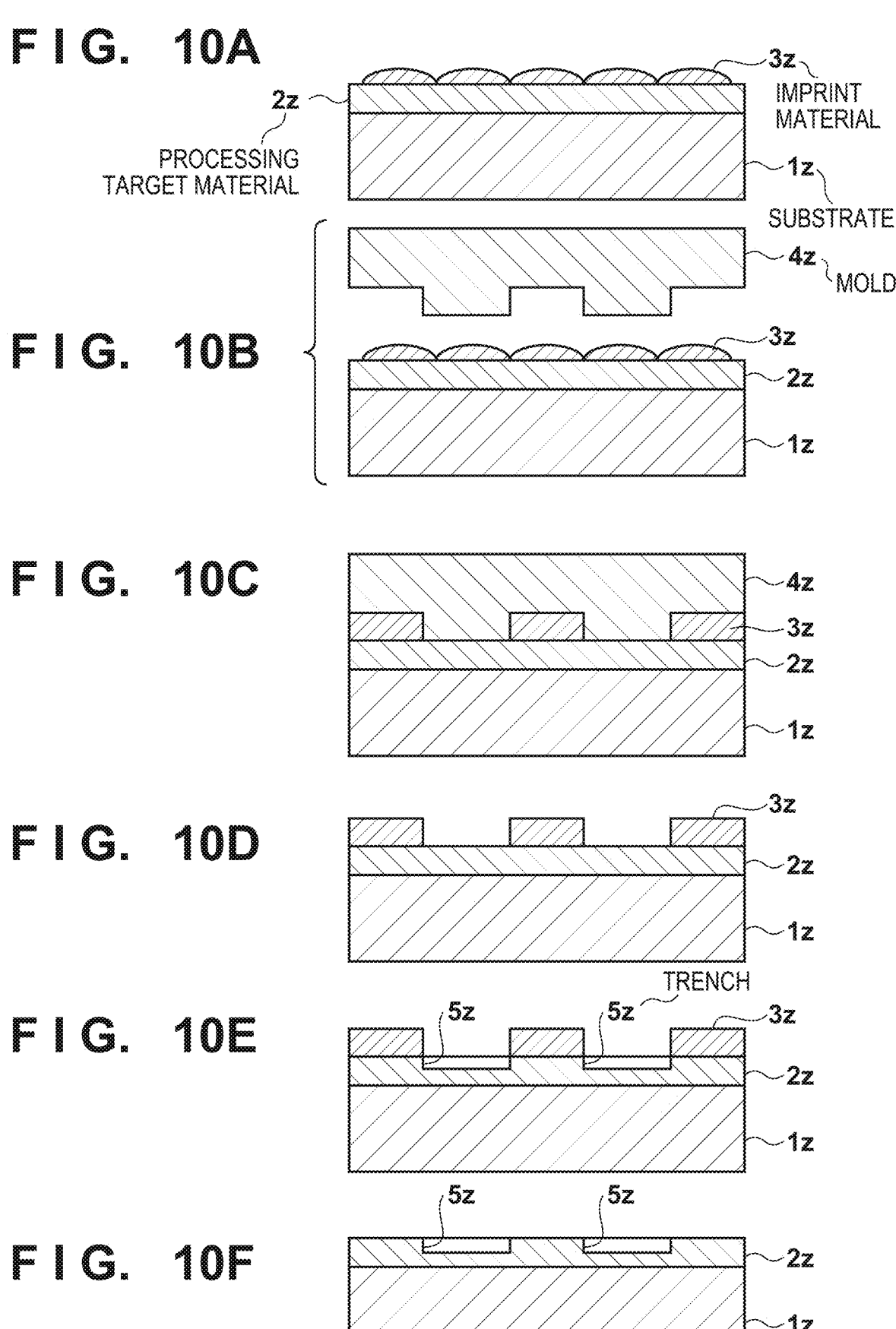
FIGS. 10A to 10F are views exemplifying an article manufacturing method.

As shown in FIG. 10B, a side of a mold 4z for imprint with a concave-convex pattern is directed to face the imprint material 3z on the substrate. As shown FIG. 10C, the substrate 1z to which the imprint material 3z has been applied is brought into contact with the mold 4z, and a pressure is applied. The gap between the mold 4z and the processed material 2z is filled with the imprint material 3z. In this state, when the imprint material 3z is irradiated with light as curing energy via the mold 4z, the imprint material 3z is cured.

As shown in FIG. 10D, after the imprint material 3z is cured, the mold 4z is separated from the substrate 1z, and the pattern of the cured product of the imprint material 3z is formed on the substrate 1z. In the pattern of the cured product, the concave portion of the mold corresponds to the convex portion of the cured product, and the convex portion of the mold corresponds to the concave portion of the cured product. That is, the concave-convex pattern of the mold 4z is transferred to the imprint material 3z.

As shown in FIG. 10E, when etching is performed using the pattern of the cured product as an etching resistant mask, a portion of the surface of the processed material 2z where the cured product does not exist or remains thin is removed to form a groove 5z. As shown in FIG. 10F, when the pattern of the cured product is removed, an article with the grooves 5z formed in the surface of the processed material 2z can be obtained. Here, the pattern of the cured product is removed. However, instead of removing the pattern of the cured product after the process, it may be used as, for example, an interlayer dielectric film included in a semiconductor element or the like, that is, a constituent member of an article.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2022-116575, filed Jul. 21, 2022, which is hereby incorporated by reference herein in its entirety.

What is claimed is:

1. A detection device for detecting a relative position between a first mark and a second mark respectively provided in a first object and a second object arranged to overlap each other, comprising:

an illumination system configured to illuminate the first mark and the second mark with illumination light, wherein the illumination system includes a pinhole plate arranged on the pupil surface of the illumination system, and the illumination light is light that has passed through a pinhole of the pinhole plate; and a detection system including an image sensor and configured to form an image on an imaging surface of the image sensor from diffracted lights from the first mark and the second mark illuminated by the illumination system, wherein the first mark and the second mark are configured to form, on the imaging surface, optical information representing the relative position in a first direction or a second direction orthogonal to the first direction, wherein the illumination light is light that passes through only an optical axis of the illumination system and a vicinity of the optical axis on a pupil surface of the illumination system, wherein a light blocking body including a first light blocking portion crossing an optical axis of the detection system in a direction parallel to a third direction and a second light blocking portion crossing the optical axis of the detection system in a direction parallel to a fourth direction is provided on a pupil surface of the detection system, and wherein the third direction is a direction conjugate to the first direction and the fourth direction is a direction conjugate to the second direction.

2. The device according to claim 1, wherein a width of the first light blocking portion in the fourth direction and a width of the second light blocking portion in the third direction are not smaller than a diameter of the pinhole.

3. The device according to claim 1, wherein the illumination system and the detection system share a prism, and the pupil surface of the illumination system is arranged between a light source and the prism, and the illumination light is reflected by the prism to illuminate the first mark and the second mark.

4. The device according to claim 3, wherein the diffracted lights from the first mark and the second mark pass through the prism to enter the imaging surface, and the pupil surface of the detection system is arranged between the prism and the imaging surface.

5. The device according to claim 1, wherein the first light blocking portion extends over a diameter in the third direction of the pupil surface of the detection system, and the second light blocking portion extends over a diameter in the fourth direction of the pupil surface of the detection system.

6. The device according to claim 1, wherein the pupil surface of the detection system includes a light transmitting region in a region where the light blocking body is not arranged, and the diffracted lights from the first mark and the second mark illuminated with the illumination light pass through the light transmitting region to form the optical information representing the relative position on the imaging surface.

7. The device according to claim 6, wherein first-order diffracted lights from the first mark and the second mark illuminated with the illumination light pass through the light transmitting region to form the optical information representing the relative position on the imaging surface.

8. The device according to claim 1, wherein the light blocking body further includes a third light blocking portion aligned with the optical axis of the detection system.

9. The device according to claim 1, wherein the illumination light is unpolarized light.

10. The device according to claim 1, wherein among lights from the first mark and the second mark illuminated with the illumination light, unnecessary light including no optical information representing the relative position is blocked by both the first light blocking portion and the second light blocking portion.

11. A lithography apparatus for transferring a pattern of an original to a substrate, comprising:

a detection device for detecting a relative position between a first mark and a second mark respectively provided in a first object and a second object arranged to overlap each other, the detection device comprising:

an illumination system configured to illuminate the first mark and the second mark with illumination light, wherein the illumination system includes a pinhole plate arranged on the pupil surface of the illumination system, and the illumination light is light that has passed through a pinhole of the pinhole plate; and a detection system including an image sensor and configured to form an image on an imaging surface of the image sensor from diffracted lights from the first mark and the second mark illuminated by the illumination system, wherein the first mark and the second mark are configured to form, on the imaging surface, optical information representing the relative position in a first direction or a second direction orthogonal to the first direction, wherein the illumination light is light that passes through only an optical axis of the illumination system and a vicinity of the optical axis on a pupil surface of the illumination system, wherein a light blocking body including a first light blocking portion crossing an optical axis of the detection system in a direction parallel to a third direction and a second light blocking portion crossing the optical axis of the detection system in a direction parallel to a fourth direction is provided on a pupil surface of the detection system, and wherein the third direction is a direction conjugate to the first direction and the fourth direction is a direction conjugate to the second direction, wherein the lithography apparatus is configured to align the original as the first object provided with the first mark and the substrate as the second object provided with the second mark based on an output from the detection device.

12. The apparatus according to claim 11, wherein the lithography apparatus is formed as an imprint apparatus.

13. An article manufacturing method comprising:

transferring a pattern of an original to a substrate using a lithography apparatus comprising:

a detection device for detecting a relative position between a first mark and a second mark respectively provided in a first object and a second object arranged to overlap each other, the detection device comprising:

an illumination system configured to illuminate the first mark and the second mark with illumination light, wherein the illumination system includes a pinhole plate arranged on the pupil surface of the illumination system, and the illumination light is light that has passed through a pinhole of the pinhole plate; and a detection system including an image sensor and configured to form an image on an imaging surface of the image sensor from diffracted lights from the first mark and the second mark illuminated by the illumination system, wherein the first mark and the second mark are configured to form, on the imaging surface, optical information representing the relative position in a first direction or a second direction orthogonal to the first direction, wherein the illumination light is light that passes through only an optical axis of the illumination system and a vicinity of the optical axis on a pupil surface of the illumination system, wherein a light blocking body including a first light blocking portion crossing an optical axis of the detection system in a direction parallel to a third direction and a second light blocking portion crossing the optical axis of the detection system in a direction parallel to a fourth direction is provided on a pupil surface of the detection system, and wherein the third direction is a direction conjugate to the first direction and the fourth direction is a direction conjugate to the second direction, wherein the lithography apparatus is configured to align the original as the first object provided with the first mark and the substrate as the second object provided with the second mark based on an output from the detection device; and processing the substrate so as to obtain an article from the substrate having undergone the transferring.

\* \* \* \* \*